(12) United States Patent
Funakoshi

(10) Patent No.: US 7,846,823 B2
(45) Date of Patent: Dec. 7, 2010

(54) MASKING PASTE, METHOD OF MANUFACTURING SAME, AND METHOD OF MANUFACTURING SOLAR CELL USING MASKING PASTE

(75) Inventor: Yasushi Funakoshi, Uda (JP)

(73) Assignee: Sharp Kabushiki Kaisha, Osaka (JP)

( * ) Notice: Subject to any disclaimer, the term of this patent is extended or adjusted under 35 U.S.C. 154(b) by 66 days.

(21) Appl. No.: 12/063,542

(22) PCT Filed: Aug. 8, 2006

(86) PCT No.: PCT/JP2006/315632

§ 371 (c)(1),
(2), (4) Date: Feb. 11, 2008

(87) PCT Pub. No.: WO2007/020833

PCT Pub. Date: Feb. 22, 2007

(65) Prior Publication Data

US 2009/0142911 A1    Jun. 4, 2009

(30) Foreign Application Priority Data

Aug. 12, 2005  (JP)  ............... 2005-234466
Sep. 16, 2005  (JP)  ............... 2005-270200

(51) Int. Cl.
*H01L 21/322* (2006.01)
*H01L 21/38* (2006.01)
*H01L 21/22* (2006.01)

(52) U.S. Cl. .............. 438/542; 438/476; 438/546; 438/549; 438/550; 438/552; 438/555; 438/556; 257/E21.135; 257/E21.141; 257/E21.142; 257/E21.143; 257/E21.144

(58) Field of Classification Search .......... 257/E21.135, 257/E21.141, E21.142, E21.143, E21.144, 257/E21.145
See application file for complete search history.

(56) References Cited

U.S. PATENT DOCUMENTS

| 3,310,442 | A | * | 3/1967 | Winstel et al. .............. 438/476 |
| 4,050,966 | A | * | 9/1977 | Wolfle et al. ................ 438/560 |
| 4,250,206 | A | * | 2/1981 | Bate et al. ................... 438/287 |
| 4,927,770 | A | | 5/1990 | Swanson |
| 6,569,252 | B1 | * | 5/2003 | Sachdev et al. ................ 134/2 |
| 6,695,903 | B1 | | 2/2004 | Kübelbeck et al. |

(Continued)

FOREIGN PATENT DOCUMENTS

JP        4-256374        9/1992

(Continued)

OTHER PUBLICATIONS

International Search Report mailed Nov. 7, 2006.

*Primary Examiner*—Savitri Mulpuri
*Assistant Examiner*—Mohsen Ahmadi
(74) *Attorney, Agent, or Firm*—Nixon & Vanderhye P.C.

(57) ABSTRACT

A masking paste used as a mask for controlling diffusion when diffusing a p-type dopant and an n-type dopant into a semiconductor substrate and forming a high-concentration p-doped region and a high concentration n-doped region is provided that contains at least a solvent, a thickening agent, and $SiO_2$ precursor and/or a $TiO_2$ precursor. Further, a manufacturing method of a solar cell is provided in which the masking paste is pattern-formed on the semiconductor substrate and then the p-type dopant and the n-type dopant are diffused.

6 Claims, 3 Drawing Sheets

U.S. PATENT DOCUMENTS

2005/0206316 A1* 9/2005 Lee et al. .................. 313/582
2006/0289055 A1* 12/2006 Sridharan et al. ........... 136/252

FOREIGN PATENT DOCUMENTS

| JP | 7-135333 | 5/1995 |
| JP | 11-097726 | 4/1999 |
| JP | 2002-124692 | 4/2002 |
| JP | 2002-539615 | 11/2002 |
| JP | 2003-257508 | 9/2003 |
| JP | 2004-56057 | 2/2004 |
| JP | 2007-220707 | 8/2007 |

* cited by examiner

MASKING PASTE, METHOD OF MANUFACTURING SAME, AND METHOD OF MANUFACTURING SOLAR CELL USING MASKING PASTE

This application is the U.S. national phase of International Application No. PCT/JP2006/315632, filed Aug. 8, 2006, which designated the U.S. and claims priority to Japanese Patent Application Nos. 2005-234466 filed Aug. 12, 2005; and 2005-270200, filed Sep. 16, 2005, the entire contents of each of which are hereby incorporated by reference.

TECHNICAL FIELD

The present invention relates to a masking paste used as a mask for controlling diffusion when diffusing a dopant into a semiconductor substrate. By using the masking paste, fine patterning of a doped region can be performed easily and less expensively. In addition, the present invention can provide a method of manufacturing solar cells, especially a backside electrode type solar cell, and furthermore a residential solar cell, that convert light into electricity with high efficiency and low cost by being able to perform the fine patterning easily.

BACKGROUND ART

Expectations for a light-power technology and a power semiconductor including a solar cell that directly converts solar light energy into electric energy have rapidly grown in recent years as a next generation energy source especially from the viewpoint of the global environmental problem. There are various types of solar cells, such as one using a compound semiconductor or an organic material. However, one using a silicon crystal is the mainstream at present. In the solar cell that is currently produced and sold most commonly at present, an n electrode is provided on a photo-detecting surface that detects sunlight, and a p electrode is provided on the backside. The n electrode provided on the photo-detecting surface side is indispensable for taking out a current. However, because no sunlight enters the substrate under this electrode, power generation does not occur in this part. Therefore, conversion efficiency decreases when the area of the electrode is large. A loss due to the electrode on the photo-detecting surface side in such way is referred to as a shadow loss.

Because the backside electrode type solar cell having no electrode on the photo-detecting surface does not suffer from a shadow loss due to the electrode and can take 100% of the incident sunlight into the solar cell, high efficiency can be theoretically realized. In Patent Document 1 (U.S. Pat. No. 4,927,770), one embodiment of the backside electrode type solar cell is disclosed that is suitable for a light-condensing type. An outline of its structure is shown in FIG. 1.

In the backside electrode type solar cell, a high-concentration p-doped region 12 and a high-concentration n-doped region 13 are provided alternately on the backside of a semiconductor substrate 10. Further, in the backside electrode type solar cell, a texture etching surface 18 is formed on the photo-detecting surface of semiconductor substrate 10. A passivation layer 11 is formed on the surface of semiconductor substrate 10, and with this, surface re-bonding is suppressed. A p electrode 14 is connected to high-concentration p-doped region 12 and an n electrode 15 is connected to high-concentration n-doped region 13 respectively through a p region contact hole 16 and an n region contact hole 17 provided on the backside, and a current is taken out from these. Passivation layer 11 on the photo-detecting surface works as a reflection preventive film also. As seen in FIG. 1, all of the high-concentration p and n-doped regions and the electrodes are formed on the backside, and because there is nothing to block the light on the surface (photo-detecting surface), 100% of the sunlight can be taken in.

The backside electrode structure of the backside electrode type solar cell has a fine pattern in which high-concentration n-doped region 13 and high-concentration p-doped region 12 are formed alternately. A manufacturing process of the solar cell is described in the following using FIG. 1.

First, passivation layer 11 is formed by forming an oxide film on the surface of semiconductor substrate 10 and then depositing a nitride film on the oxide film. Next, using a photolithography technique, n region contact hole 17 is opened in passivation film 11 and a glass layer containing an n-type dopant is deposited on the surface of semiconductor substrate 10 by CVD (a chemical vapor deposition method). A part of the glass layer that corresponds to the high-concentration p-doped region is removed, p region contact hole 16 is formed in passivation film 11 by a photolithography technique, and a glass layer containing a p-type dopant is deposited on the surface of semiconductor substrate 10. When this semiconductor substrate 10 is heated at 900° C., high-concentration p-doped region 12 and high-concentration n-doped region 13 are formed on the backside. After that, the entire glass layer remaining on the surface of semiconductor substrate 10 is removed, a thermal process is performed at a high temperature of 900° C. or more, and a hydrogenated process is performed on the interface between Si—$SiO_2$ in $H_2$. After removing two glass layers that became a diffusion source, p electrode 14 and n electrode 15 are formed by depositing Al on the backside of semiconductor substrate 10 by sputtering or the like, and patterning by a photolithography technique.

Further, as to a semiconductor doping technique, researches of a dopant paste that can screen-print to form p, p+, n, and n+ regions on a single crystal and polycrystalline silicon substrate less expensively and easily and a masking paste that controls dopant diffusion in semiconductor manufacturing have been carried out (refer to Patent Document 2 (Japanese National Patent Publication No. 2002-539615)).

Further, researches related to a technique of performing patterning with a mask for controlling diffusion of a dopant in advance and then performing doping in order to overcome a decrease in a minority carrier lifetime of the semiconductor substrate in the manufacturing process of the solar cell have been carried out (refer to Patent Document 3 (Japanese Patent Laying-Open No. 2002-124692)).

Patent Document 1: U.S. Pat. No. 4,927,770

Patent Document 2: Japanese National Patent Publication No. 2002-539615

Patent Document 3: Japanese Patent Laying-Open No. 2002-124692

DISCLOSURE OF THE INVENTION

Problems to be Solved by the Invention

However, the backside electrode type solar cell as in FIG. 1 has been developed as a concentrating solar cell in the beginning, and a complicated photolithography technique, a high quality doping technique, and a passivation technique have been used in its production. As a result, the manufacturing cost of the backside electrode type solar cell becomes high, and the cell is not suitable as a general terrestrial solar cell, that is, a residential solar cell. Therefore, in order to make the manufacturing cost of the backside electrode type solar cell as in FIG. 1 lower, it becomes necessary to simplify the manufacturing process of the solar cell. In order to do that, it is preferable to perform the fine patterning formation of the high-concentration n-doped region and the high-concentration p-doped region without using the complicated photolithography technique or the like.

Therefore, an objective of the present invention is to provide a masking paste that is used as a mask for controlling diffusion when diffusing a dopant into a semiconductor substrate, having characteristics that it is easily applied and printed and having a diffusion controlling function. Using the masking paste of the present invention, fine patterning of the doped region can be performed easily and less expensively. In addition, the present invention aims to provide a method of manufacturing a backside electrode type solar cell with a low cost by performing fine patterning easily.

Further, the present invention aims to develop a manufacturing method of a solar cell having a step of structuring a solar cell with a low cost technique such as screen printing alternatively to the photolithography technique.

Means for Solving the Problems

The present invention relates to a masking paste that is used as a mask for controlling diffusion when diffusing a dopant and forming a doped region in a semiconductor substrate, containing at least a solvent, a thickening agent, and a $SiO_2$ precursor and/or a $TiO_2$ precursor. Further, in the masking paste, the solvent is preferably butylcellosolve and/or N-ethyl-2-pyrrolidone. Further, in the masking paste, the thickening agent is preferably ethyl cellulose and/or polyvinylpyrrolidone. Further, in the masking paste, the $SiO_2$ precursor is preferably formed by a formula $R'_n Si(OR)_{4-n}$ ($R'$ is methyl, ethyl, or phenyl, R is methyl, ethyl, n-propyl, or i-propyl, and n is 0, 1, or 2), and preferably formed by silane selected as an individual or a mixture from the group consisting of tetramethoxysilane, tetraethoxysilane, tetrabutoxysilane, tetrapropoxysilane, and tetramethoxysilane. Further, in the masking paste, the $SiO_2$ precursor is preferably formed by siloxane and polysiloxane. Further, in the masking paste, the $TiO_2$ precursor is preferably formed by a formula $R'_n Ti(OR)_{4-n}$ ($R'$ is methyl, ethyl, or phenyl, R is methyl, ethyl, n-propyl, or i-propyl, and n is 0, 1, or 2). Further, in the masking paste, the $TiO_2$ precursor is preferably formed by an individual or a mixture from the group consisting of tetraisopropoxy titanium, $TiCl_4$, $TiF_4$, and $TiOSO_4$. Further, in the masking paste, the concentration of the $SiO_2$ precursor and/or the $TiO_2$ precursor in the masking paste is preferably 5 to 15% by mass. Further, in the masking paste, the concentration of the thickening agent in the masking paste preferably 5 to 15% by mass.

Further, the manufacturing method of the present invention relates to a manufacturing method of a masking paste used as a mask for controlling diffusion when diffusing a dopant and forming a doped region in a semiconductor substrate, in which a mixed liquid containing a formula $R'_n Si(OR)_{4-n}$, ($R'$ is methyl, ethyl, or phenyl, R is methyl, ethyl, n-propyl, or i-propyl, and n is 0, 1, or 2), a solvent, a thickening agent, an acid, and water is prepared and then alcohol is vaporized by heating at a temperature not lower than the boiling point of the alcohol produced by a hydrolysis reaction of the formula $R'_n Si(OR)_{4-n}$($R'$ is methyl, ethyl, or phenyl, R is methyl, ethyl, n-propyl, or i-propyl, and n is 0, 1, or 2), and not higher than the boiling point of the solvent.

Further, the manufacturing method of the present invention relates to a manufacturing method of a masking paste used as a mask for controlling diffusion when diffusing a dopant and forming a doped region in a semiconductor substrate, in which a mixed liquid containing the formula $R'_n Si(OR)_{4-n}$($R'$ is methyl, ethyl, or phenyl, R is methyl, ethyl, n-propyl, or i-propyl, and n is 0, 1, or 2), a solvent, an acid, and water is prepared, alcohol is vaporized by heating at the temperature not lower than the boiling point of the alcohol produced by a hydrolysis reaction of the formula $R'_n Si(OR)_{4-n}$, ($R'$ is methyl, ethyl, or phenyl, R is methyl, ethyl, n-propyl, or i-propyl, and n is 0, 1, or 2), and not higher than the boiling point of the solvent, and then a thickening agent is added.

Further, the manufacturing method of the present invention relates to a manufacturing method of a solar cell, in which the above-described masking paste is pattern-formed on a semiconductor substrate and then a dopant is diffused.

Further, the manufacturing method of the present invention relates to a manufacturing method of a solar cell, in which a patterned diffusion layer is formed by applying the above-described masking paste on a semiconductor substrate by patterning, forming a mask for controlling diffusion of a dopant by baking in an oxygen atmosphere, and then performing doping.

Further, the manufacturing method of the present invention relates to a manufacturing method of a solar cell, in which a patterned diffusion layer is formed by applying a paste containing $SiO_2$ and/or a $SiO_2$ precursor on a semiconductor substrate by patterning, forming a mask for controlling diffusion of a dopant by baking in an oxygen atmosphere, and then performing doping. Further, in the manufacturing method of the present invention, the diffusion of the dopant is preferably gas phase diffusion or application diffusion. Further, in the manufacturing method of the present invention, the baking is performed desirably at a baking temperature of 800 to 1050° C. and for a baking time of 10 to 60 minutes. Further, in the manufacturing method of the present invention, the diffusion temperature of the diffusion of the dopant is preferably not lower than 800° C. for a p-type dopant diffusion, and not lower than 700° C. for an n-type dopant diffusion. Further, in the manufacturing method of the present invention, the paste preferably contains 5 to 25% by mass of tetraethylorthosilicate as the $SiO_2$ precursor substance, 5 to 25% by mass of ethylcellulose as a thickening agent, and 0.1% by mass of an acid as a catalyst for a hydrolysis reaction of tetraethylorthosilicate.

EFFECTS OF THE INVENTION

A masking paste that is used as a mask for controlling diffusion when diffusing a dopant into a semiconductor substrate can be provided having characteristics that it is easily applied and printed and having a diffusion controlling function. Further, a mask for controlling diffusion can be formed by applying (printing) the masking paste on a semiconductor substrate in a desired shape and baking the applied masking paste. As a result, fine pattering formation of the n-doped region and the p-doped region can be performed easily, and a backside bonding type solar cell can be manufactured with a low cost.

DESCRIPTION OF THE REFERENCE SIGNS

Figure 1:
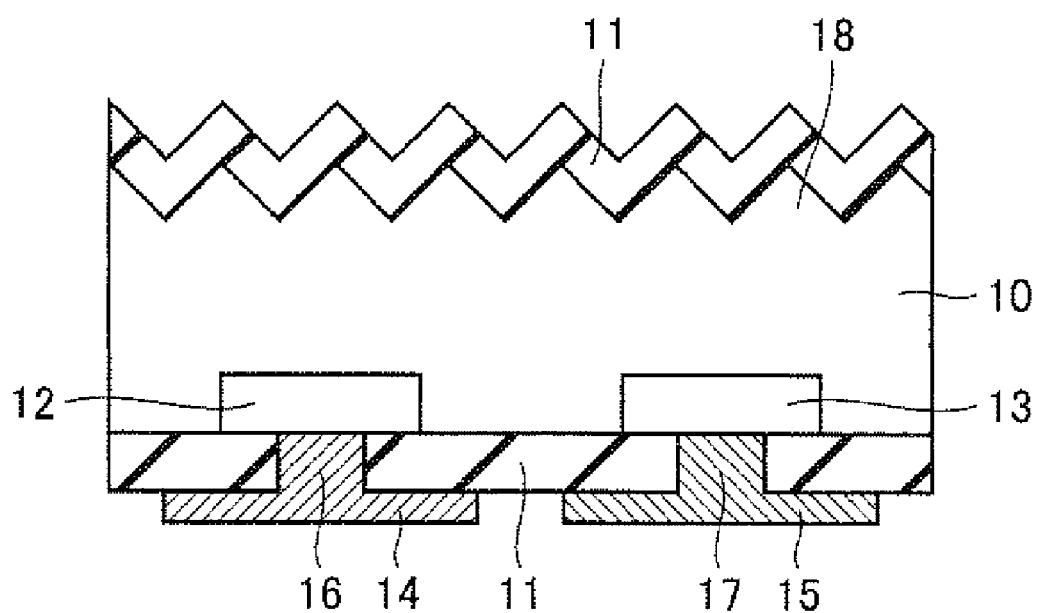
FIG. 1 is a schematic cross-sectional view of a backside electrode type solar cell.

10 semiconductor substrate, 11 passivation layer, 12 high-concentration p-doped region, 13 high-concentration nn-doped region, 14 p electrode, 15 n electrode, 16 p region contact hole, 17 n region contact hole, 18 texture etching surface, 30 masking paste, 31 p-type dopant, 32 n-type dopant, 33 mask for controlling diffusion

BEST MODES FOR CARRYING OUT THE INVENTION

Role of Masking Paste

The masking paste is used to form a mask for controlling diffusion on a semiconductor substrate. The mask for controlling diffusion refers to a film having a controlling function of suppressing or stopping the dopant diffusion. The dopant diffusion occurs only on a part where the masking paste is not applied and printed on a semiconductor substrate. Therefore, a doped region and a region not doped can be easily manufactured by using the masking paste. Therefore, as a result, fine patterning of an n-doped region and a p-doped region can be performed easily.

<Composition of Masking Paste>

The masking paste of the present invention contains at least a solvent, a thickening agent, and $SiO_2$ precursor and/or a $TiO_2$ precursor. Further, the masking paste of the present invention may be a paste containing $SiO_2$ and/or a $SiO_2$ precursor. Examples of an appropriate solvent that can be used include hydrophilic polyhydric alcohols such as ethylene glycol, methylcellosolve, methylcellosolve acetate, ethylcellosolve, diethylcellosolve, cellosolve acetate, ethylene glycol monophenyl ether, methoxymethoxy ethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methylethyl ether, diethylene glycol diethyl ether, diethylene glycol acetate, triethyl glycol, triethylene glycol monomethyl ether, triethylene glycol monoethyl ether, tetraethylene glycol, liquid polyethylene glycol, propylene glycol, propylene glycol monomethyl ether, propylene glycol monoethyl ether, propylene glycol monobutyl ether, 1-butoxyethoxypropanol, dipropyl glycol, dipropyl glycol monomethyl ether, dipropylene glycol monoethyl ether, tripropylene glycol monomethyl ether, polypropylene glycol, trimethylene glycol, butanedial, 1,5-pentanedial, hexylene glycol, glycerin, glyceryl acetate, glycerin diacetate, glyceryl triacetate, trimethylolpropyne, 1,2,6-hexanetriol, and a hydrophilic derivative of these, aliphatic and aromatic polyhydric alcohols such as 1,2-propanediol, 1,5-pentanediol, and octanediol, an ester and an ether of these, 1,2-butanediol, 1,4-butanediol, 1,3-butanediol, hydrophilic ethers such as dioxane, trioxane, tetrahydrofran, and tetrahydropyran, methylal, diethylacetal, methylethylketone, methylisobutylketone, diethylketone, acetonylacetone, diacetone alcohol, hydrophilic esters such as methylformate, ethylformate, propylformate, methylacetate, and ethylacetate, and a mixture of these solvents. However, it is especially preferable to use butyl cellosolve, N-methyl-2-pyrrolidone, or a mixture of both butyl cellosolve and N-methyl-2-pyrrolidone.

It is preferable to use ethyl cellulose, polyvinylpyrrolidone, or a mixture of both ethyl cellulose and polyvinylpyrrolidone as the thickening agent. However, bentonite of various quality and characteristics, a rheology additive that is generally inorganic and for a mixture of various polar solvents, nitrocellulose and other cellulose compounds, starch, gelatin, alginic acid, highly dispersive non-crystalline silicic acid (Aerosil (registered trademark)), polyvinylbutyral (Mowital (registered trademark)), sodium carboxymethyl cellulose (vivistar), a thermoplastic polyamide resin (Eurelon (registered trademark)), an organic castor oil derivative (Thixin R (registered trademark)), a diamide wax (Thixatrol plus (registered trademark)), swelled polyacrylate (Rheolate (registered trademark)), polyether urea-polyurethane, polyether-polyol, and the like can be also used.

Especially, when performing masking using the masking paste of the present invention in an n-type semiconductor substrate, a solvent and a thickening agent are preferably used with a combination of butyl cellusolve and ethyl cellulose in the masking of the n-type dopant diffusion and with a combination of N-methyl-2-pyrrolidone and polyvinylpyrrolidone in the masking of the p-type dopant diffusion.

Further, because when the viscosity of the masking paste is too low, the masking paste leaks out from the spacing of the printing screen, and on the contrary when the viscosity is too high, the masking paste hardly attaches to the semiconductor substrate, the concentration of the thickening agent in the masking paste is preferably set to 5 to 15% by mass, and more preferably 8 to 12% by mass.

Further, the main component of the mask for controlling diffusion produced from the masking paste is $SiO_2$ and/or $TiO_2$. Therefore, in order to have a high diffusion controlling effect as a mask for controlling diffusion, a higher concentration of the $SiO_2$ precursor and/or the $TiO_2$ precursor in the masking paste is better. In order to exhibit a diffusion controlling mask property, a thickness of about 300 nm is necessary. However, in the case that the concentration of the $SiO_2$ precursor and/or the $TiO_2$ precursor is high, there is a possibility of cracks when a film with a thickness of 1000 nm or more is formed from the masking paste. Therefore, the concentration of the $SiO_2$ precursor and/or the $TiO_2$ precursor contained in the masking paste is preferably 5 to 15% by mass, and more preferably 5 to 8% by mass.

The $SiO_2$ precursor is considered to normally exist in a form of $Si(OH)_4$ in the masking paste, changes into $SiO_2$ by a step of drying and baking, and plays a role as a mask for controlling diffusion. Other substances that form the $SiO_2$ precursor include a substance represented by $R'_n Si(OR)_{4-n}$ such as TEOS (tetraethylorthosilicate), and silane selected as an individual or a mixture from the group consisting of tetramethoxysilane, tetraethoxysitane (tetraethylorthosilicate), tetrabutoxysilane, and tetrapropoxysilane, siloxane, and polysiloxane (R' is methyl, ethyl, or phenyl, R is methyl, ethyl, n-propyl, or i-propyl, and n is 0, 1, or 2).

Substances that form the $TiO_2$ precursor other than $Ti(OH)_4$ include a substance represented by $R'_n Ti(OR)_{4-n}$ such as TPT (tetraisopropoxy titanium) (R' is methyl, ethyl, or phenyl, R is methyl, ethyl, n-propyl, or i-propyl, and n is 0, 1, or 2), $TiCl_4$, $TiF_4$, and $TiOSO_4$.

<Manufacturing Method of Masking Paste>

<<Manufacturing Method of Masking Paste Using $SiO_2$ Precursor>>

First, a substance represented by a formula $R'_n Si(OR)_{4-n}$ (R' is methyl, ethyl, or phenyl, R is methyl, ethyl, n-propyl, or i-propyl, and n is 0, 1, or 2) such as TEOS (tetraethylorthosilicate) (in the following, the description is made using TEOS as an example), a solvent, water, and hydrochloric acid as an acid were placed in a glass jar, and the mixture was stirred well for about 10 minutes, and left as it is for about 6 hours. With this process, a chemical reaction was caused between TEOS and water using hydrochloric acid as the acid as a catalyst, and ethyl alcohol produced by the hydrolysis reaction of TEOS and Si(OH)$_4$ were generated. The chemical reaction is shown in Formula (I).

$$Si(OC_2H_5)_4 + 4H_2O \rightarrow Si(OH)_4 + 4CH_3CH_2OH \quad (1)$$

Here, in the present invention, the acid is used as a catalyst, and any acid such as an inorganic acid such as nitric acid or sulfuric acid and an organic acid such as formic acid, acetic acid, or oxalic acid may be used. However, hydrochloric acid that hardly gives an influence on a semiconductor and that is easily available is preferably used.

However, in the case of producing a masking paste just as it is, it becomes a masking paste that extremely easily solidifies because of the high volatility of alcohol generated by the hydrolysis reaction of the formula $R'_n Si(OR)_{4-n}$ ($R'$ is methyl, ethyl, or phenyl, R is methyl, ethyl, n-propyl, or i-propyl, and n is 0, 1, or 2), that is, ethyl alcohol in the present embodiment. Therefore, in the present embodiment, in order to produce a masking paste that can perform screen printing smoothly, it is effective to perform a step of heating the solution in the glass jar after performing the chemical reaction to about 80° C. (not lower than the boiling point of the ethyl alcohol that is generated and not higher than the boiling point of the solvent) for several tens of minutes and vaporizing ethyl alcohol in the solution.

Moreover, when manufacturing a masking paste using siloxane and polysiloxane, the hydrolysis reaction is not necessary.

At the end, a masking paste is completed by stirring sufficiently the solution in which ethyl cellulose is mixed as a thickening agent. At this time, describing the case of applying a masking paste by screen printing as an example, when the viscosity of the masking paste is too low, the masking paste leaks out from the spacing of the printing screen, and on the contrary when the viscosity is too high, the masking paste is hardly transferred (applied) onto a substrate (a silicon substrate or the like). Therefore, the masking paste is completed by mixing the thickening agent at a concentration of 5 to 25% by mass to the amount of the masking paste, preferably 5 to 15% by mass, and more preferably 8 to 12% by mass and stirring the mixture sufficiently. However, the thickening agent may be mixed in before the above-described step of vaporizing the ethyl alcohol.

Further, because the main component of the mask for controlling diffusion is $SiO_2$, in order for the thin film made of $SiO_2$ to exhibit a diffusion controlling mask property, a higher concentration of TEOS as the $SiO_2$ precursor in the masking paste is better. However, when the TEOS concentration is too high, there is a possibility of cracks when forming the mask for controlling diffusion. Therefore, the concentration of TEOS ($SiO_2$ precursor) contained in the masking paste is set to be 5 to 25% by weight of the masking paste.

<<Manufacturing Method of Masking Paste Using $TiO_2$ Precursor>>

Using $TiO_2$, a hard mask for controlling diffusion that hardly dissolves in a hydrofluoric acid aqueous solution can be formed.

First, a substance represented by a formula $R'_n Ti(OR)_{4-n}$ ($R'$ is methyl, ethyl, or phenyl, R is methyl, ethyl, n-propyl, or i-propyl, and n is 0, 1, or 2) such as TPT (tetraisopropoxy titanium) (in the following, the description is made using TPT as an example) and a solvent are placed in a glass jar and the mixture is stirred well for about 10 minutes. Because TPT reacts easily with water and forms immediately $TiO_2$, it is not necessary to add water or an acid different from the above-described reaction of the $SiO_2$ precursor. Further, because alcohol by a hydrolysis reaction is not generated, it is not necessary to perform a step of heating and vaporizing as in the case of using the $SiO_2$ precursor. At the end, the masking paste is completed by mixing the thickening agent at 5 to 15% by mass to the amount of the masking paste and more preferably 8 to 12% by mass and stirring the mixture sufficiently. Moreover, other than TPT, $TiCl_4$, $TiF_4$, $TiOSO_4$, or the like can be used as the $TiO_2$ precursor.

<Manufacturing Method of Solar Cell Using $SiO_2$ Precursor-Containing Masking Paste>

Figure 2:
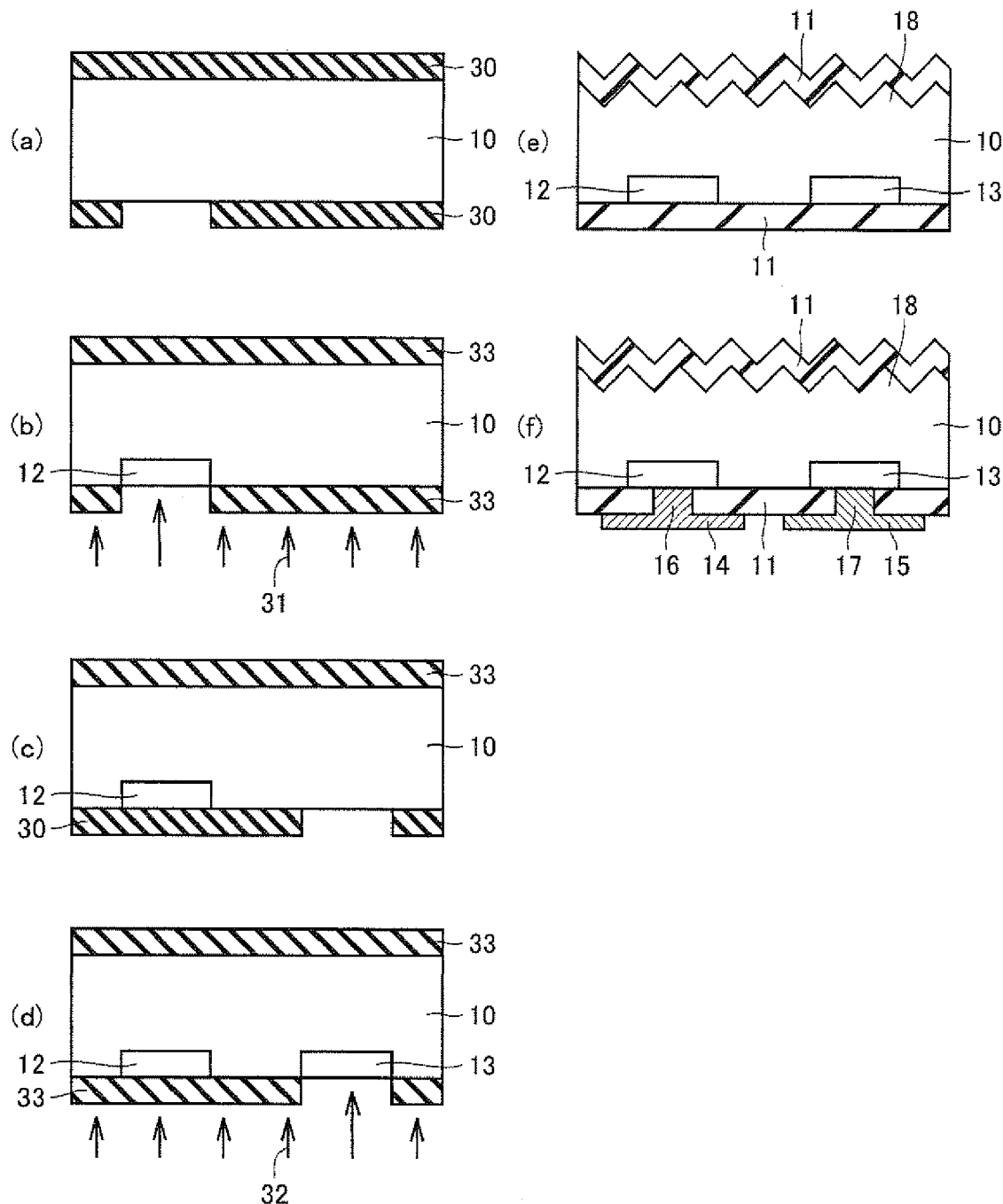
FIG. 2 is a schematic cross-sectional view showing a manufacturing method of a solar cell according to the present invention.

A method of manufacturing a backside electrode type solar cell using a $SiO_2$ precursor-containing masking paste produced by the above-described method is described using FIG. 2 as an example. First, masking paste 30 is screen-printed on the entire surface of the photo-detecting surface side of semiconductor substrate 10 and dried at about 300° C. for several tens of minutes using an oven. Next, partial openings are provided on the backside and masking paste 30 is screen-printed (FIG. 2(a)).

Next, $SiO_2$ that is a material of a mask for controlling diffusion 33 contained in masking paste 30 is sintered by baking this semiconductor substrate 10 at 800 to 1000° C. for 10 to 60 minutes. The baking is preferably performed under an oxygen atmosphere. After that, p-type dopant 31 is diffused at 800 to 1000° C. for 30 to 100 minutes to diffuse p-type dopant 31 into only a part corresponding to the opening of mask for controlling diffusion 33 in semiconductor substrate 10, and high-concentration p-doped region 12 is formed (FIG. 2(b)).

The diffusing method of the dopant includes a gas phase diffusion method and an ion implantation method. After that, mask for controlling diffusion 33 can be removed by soaking semiconductor substrate 10 in a hydrofluoric acid aqueous solution with a concentration of about 10% for about 1 minute.

Masking paste 30 is again screen-printed after partial openings are provided on the backside of semiconductor substrate 10, and baked in the same condition as described above (FIG. 2(c)).

Then, by performing diffusion of n-type dopant 32 by applying the same step as described above, high-concentration n-doped region 13 can be formed in semiconductor substrate 10 (FIG. 2(d)).

After forming each doped region as described above, by keeping semiconductor substrate 10 at about 75 to 85° C. and soaking it in 1 to 10% by mass of a potassium hydroxide or sodium hydroxide solution in which 1 to 10% by mass of isopropyl alcohol is added to the potassium hydroxide solution or the like as a surfactant for 10 to 60 minutes, texture etching surface 18 is formed on the photo-detecting surface. Examples of the method of forming texture etching surface 18 include a method using an aqueous solution of hydrazine, and the like. However, any method that can form a texture structure that suppresses reflection of incident light at the photo-detecting surface can be used.

Next, passivation layer 11 is formed by forming a silicon nitride film on both surfaces of semiconductor substrate 10, and passivation is performed (FIG. 2(e)).

Then, a backside electrode type solar cell is manufactured by providing p region contact hole 16 and n region contact hole 17 by performing a hole opening process in passivation layer 11 in the backside, and then forming p electrode 14 and n electrode 15 (FIG. 2(f)).

<Manufacturing Method of Solar Cell Using TiO$_2$ Precursor-Containing Masking Paste>

The method can be performed in the same manner as the above-described manufacturing method of a solar cell except that the TiO$_2$ precursor-containing masking paste produced by the above-described method is used. However, because a hard TiO$_2$-containing mask for controlling diffusion that hardly dissolves into a hydrofluoric acid aqueous solution is used, there is a necessity to soak the semiconductor substrate into the hydrofluoric acid 10% aqueous solution for about 60 minutes when removing the mask for controlling diffusion.

<Manufacturing Method of Solar Cell in Which Masking Paste is Baked in Oxygen Atmosphere>

FIG. 2 is a schematic cross-sectional view of a manufacturing method of a solar cell according to the present invention. In the following, a method of manufacturing a backside bonding type solar cell using a masking paste is described in accordance with FIG. 2. In the manufacturing method of the present embodiment, a masking paste consisting of a paste containing SiO$_2$ and/or a SiO$_2$ precursor is used.

First, a slice damaged surface of semiconductor substrate 10 is etched and removed with an alkaline solution such as a mixed acid of fluoric acid and nitric acid or a potassium hydroxide solution. Then, masking paste 30 is applied on the entire surface of the photo-detecting surface side of semiconductor substrate 10 by a method such as screen printing, semiconductor substrate 10 is placed in an oven, and masking paste 30 is dried at about 300° C. for several tens of minutes using the oven. Next, masking paste 30 is applied on the backside also by a method such as screen printing. At this time, masking paste 30 is applied on the backside with a pattern in which an opening is provided in a desired shape. Then, in the same manner, masking paste 30 applied on the backside is dried with an oven (FIG. 2(a)).

Next, this semiconductor substrate 10 is baked at 800 to 1050° C. in an oxygen atmosphere for 10 to 60 minutes, and sintered to SiO$_2$ that is a material of mask for controlling diffusion 33. At this time, it is important to sinter the substrate in an oxygen atmosphere, and sufficient diffusion controllability cannot be obtained when annealing is performed in a nitrogen or air atmosphere. A dense film is formed in the oxygen atmosphere. Further, in the case that the baking temperature is less than 800° C., there is a fear that sufficient diffusion controllability cannot be obtained. Of course, when it is kept at high temperature in the oxygen atmosphere, an oxide film is also formed in the opening of mask for controlling diffusion 33 on semiconductor substrate 10, and there is a possibility that diffusion of the dopant is hindered. When diffusion of the dopant is actually performed in the same condition on semiconductor substrate 10 in which oxidation is performed at 800 to 1050° C. and semiconductor substrate 10 in which the oxidation is not performed, there is a difference in the sheet resistance of about a few to 10% in both p-type doped regions and n-type doped regions. However, this is a level that can be controlled by changing the diffusion temperature and the diffusion time of the dopant, and effectiveness is immense in which a patterning can be performed by applying masking paste 30 that forms mask for controlling diffusion 33 by a method such as screen printing.

After that, p-type dopant 31 is diffused in only a part corresponding to the opening of mask for controlling diffusion 33 in semiconductor substrate 10 by diffusing p-type dopant 31 into semiconductor substrate 10 at 800° C. or more, more preferably 800 to 1050° C., for 30 to 100 minutes, and high-concentration p-doped region 12 is formed.

At this time, the diffusion method includes vapor phase diffusion and coating diffusion in which a solution containing boron (B) is applied by spin coating and annealed at a high temperature. After that, mask for controlling diffusion 33 on both surfaces of semiconductor substrate 10 can be removed by soaking the substrate in fluoric acid with a concentration of about 10% for about 1 minute (FIG. 2(b)).

For n-type dopant diffusion also, masking paste 30 is again screen-printed on the entire surface of the photo-detecting surface side of semiconductor substrate 10 and dried, an opening is provided partially on the backside, and the paste is applied by a method such as screen printing and dried. Semiconductor substrate 10 is baked in the same condition as described above, and sintered to SiO$_2$ that is a material of mask for controlling diffusion 33 (FIG. 2(c)).

After that, high-concentration n-doped region 13 is formed in semiconductor substrate 10 by diffusing n-type dopant 32 at 700° C. or more, more preferably 700 to 1000° C., for 30 to 60 minutes (FIG. 2(d)).

At this time, examples of a diffusion method of the dopant include gas phase diffusion and coating diffusion of spin coating a solution containing phosphorous (P) and performing annealing at a high temperature.

After forming each doped region as described above, mask for controlling diffusion 33 on both surfaces of semiconductor substrate 10 is removed by soaking the substrate in fluoric acid of about 10% for about 1 minute. Then, a texture etching mask is formed with an oxide film or a nitride film on the backside of semiconductor substrate 10. Texture etching surface 18 is formed on the photo-detecting surface by soaking semiconductor substrate 10 into 1 to 10% by mass of a solution of potassium hydroxide or sodium hydroxide in which 1 to 10% by mass of isopropyl alcohol is added as a surfactant and kept at about 75 to 85° C. for 10 to 60 minutes. Examples of the method of forming texture etching surface 18 include a method using an aqueous solution of, and the like. However, any method can be used as long as a texture structure that suppresses reflection of incident light can be formed on the photo-detecting surface.

After removing the texture etching mask with 10% fluoric acid, passivation layer 11 is formed on both surfaces of semiconductor substrate 10 (FIG. 2(e)).

Passivation layer 11 on the photo-detecting surface side serves also as an anti-reflection film, and an oxide film or a nitride film is used as a passivation film.

After that, p region contact hole 16 and n region contact hole 17 are provided by performing a hole opening process in passivation layer 11 in the backside, and a backside bonding type solar cell is produced by forming p electrode 14 and n electrode 15 (FIG. 2(f)).

Further, it is possible to form texture etching surface 18 before applying a masking paste (FIG. 2(a)). In this case, after a slice damaged surface of semiconductor substrate 10 is etched and removed, the texture etching mask is formed on the backside of semiconductor substrate 10 with an oxide film or a nitride film, and texture etching surface 18 is formed on the photo-detecting surface by the same method as described above. After that, a backside bonding type solar cell is produced by the same method as described above using a masking paste.

Further, in the present embodiment, diffusion of p-type dopant 31 is performed first. However, diffusion of n-type dopant 32 may be performed first.

In such a manner, the doped region can be pattern-formed easily by performing diffusion control using masking paste 30 as mask for controlling diffusion 33, and a backside bonding type solar cell having a complicated distribution of dopant concentration can be mass-produced with a low cost.

Example 1

First, 30 g of TEOS (tetraethylorthosilicate), 100 g of butyl cellosolve as a solvent, 10 g of water, and 0.1% by mass of hydrochloric acid were placed in a glass jar, the mixture was stirred well for 10 minutes, and left as it is for 6 hours. With this process, a chemical reaction was caused between TEOS and water using hydrochloric acid as a catalyst, and ethyl alcohol and $Si(OH)_4$ were generated.

Further, in order to smoothly perform printing of the masking paste completed as a result onto a semiconductor substrate, a step of vaporizing ethyl alcohol in the solution by heating the solution in the glass jar at about 80° C. (not lower than the boiling point of generated ethyl alcohol and not higher than the boiling point of the solvent) for 60 minutes was performed. Finally, a masking paste was produced by mixing 10 g of ethyl cellulose as a thickening agent into the glass jar and stirring the mixture sufficiently.

Example 2

First, 30 g of TPT (tetraisopropoxy titanium) and 100 g of butyl cellosolve as a solvent were placed in a glass jar and the mixture was stirred well for 10 minutes. Finally, a masking paste was produced by mixing 15 g of ethyl cellulose as a thickening agent into the glass jar and stirring the mixture sufficiently.

Example 3

The entire surface of the photo-detecting surface side of an n-type silicon substrate was screen-printed with the masking paste obtained in Example 1, and the masking paste was dried at about 300° C. for 20 minutes using an oven. Next, the backside was provided with partial openings of the screen and the substrate was printed. The screen printing was performed with a design with an opening width of 0.5 mm and with an interval of 1.0 mm so that the masking paste has a width of 0.5 mm and a height of 10 μm. Next, this silicon substrate was baked at 900° C. for 60 minutes, and $SiO_2$ that is a material of a mask for controlling diffusion was sintered. After that, a p-type dopant was diffused only at the part corresponding to the opening of the mask for controlling diffusion in the silicon substrate by diffusing the p-type dopant by a thermal diffusion method at 1000° C. for 30 minutes, and a high-concentration p-doped region was formed. After that, the mask for controlling diffusion was removed by soaking the silicon substrate in a hydrofluoric acid aqueous solution with a concentration of 10% for about 1 minute.

Figure 3:
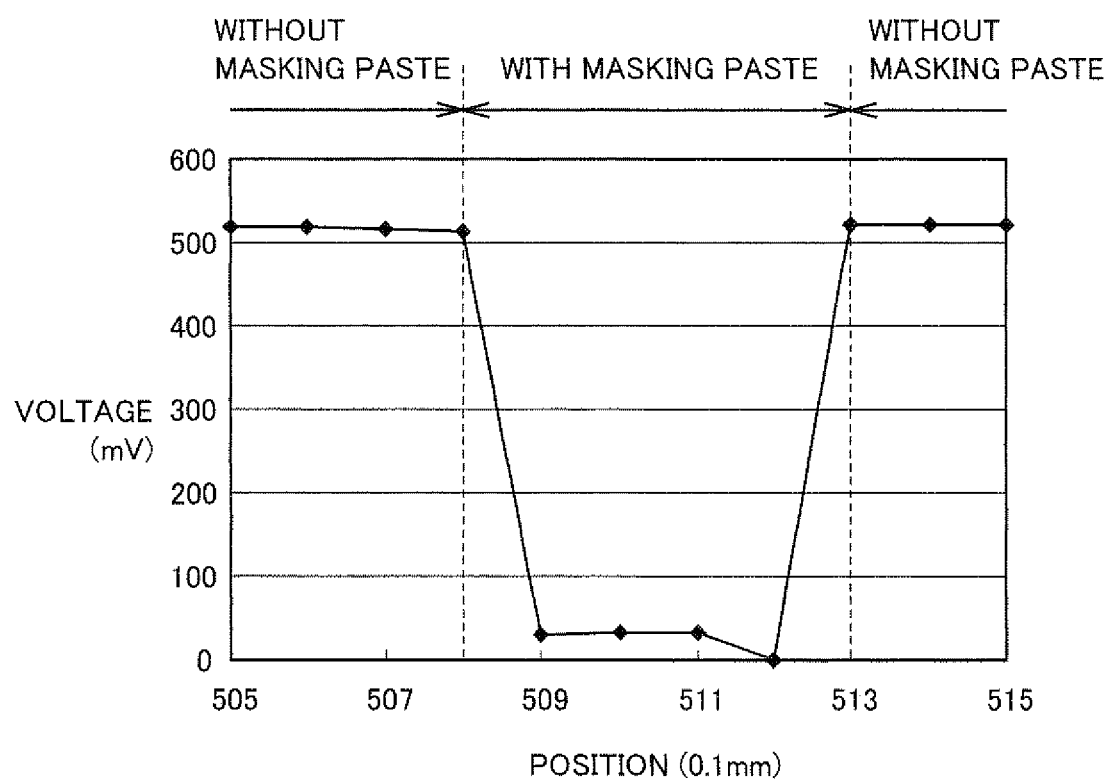
FIG. 3 is a drawing showing the voltage distribution under light irradiation of an n-type silicon substrate in which patterning of a p-doped region is performed using a masking paste by the method in Example 3.

FIG. 3 is a graph of the voltage distribution under light irradiation of the n-type silicon substrate in which patterning of the p-doped region was performed using the masking paste by the above-described method. The vertical axis shows the voltage, and the horizontal axis shows an arbitrary position in which the masking paste was printed on the substrate and an arbitrary position of a part where the masking paste was not printed in an increment of 0.1 mm. The p-type doping was performed in the region where the masking paste was not printed, and a voltage was generated because a pn junction was formed. However, it was found that a voltage was hardly generated in the region where the masking paste was printed because the p-type doping was not performed and a pn junction was not formed.

Also for the n-type dopant diffusion, the masking paste was screen-printed again after providing partial openings on the backside of the silicon substrate, and then a high-concentration n-doped region was formed by applying the same step as described above.

The texture etching surface was formed on the photo-detecting surface by forming each doped region as described above, keeping this silicon substrate at 80° C., and soaking the substrate in 3% by mass of a potassium hydroxide solution in which 6% by mass of isopropyl alcohol is added as a surfactant into a potassium hydroxide solution for 40 minutes. In order to form texture etching, an anisotropic etching method by an alkaline solution was used.

Next, a silicon nitride film was formed on both surfaces of the silicon substrate with PECVD (Plasma Enhanced Chemical Vapor Deposition). The silicon nitride film was made to be a passivation layer. A backside electrode type solar cell was produced by performing a hole opening process in the passivation layer on the backside, providing a p region contact hole and an n region contact hole, and forming a p electrode and an n electrode.

Example 4

The entire surface of the photo-detecting surface side of a silicon substrate was screen-printed with the masking paste obtained in Example 2, and the masking paste was dried at about 300° C. for 20 minutes using an oven. Next, the backside was screen-printed with a design with an opening width of 0.5 mm and with an interval of 1.5 mm so that the masking paste has a width of 0.75 mm and a height of 10 μm by partially providing openings of the screen. Next, this silicon substrate was baked at 900° C. for 60 minutes, and $TiO_2$ that is a material of a mask for controlling diffusion was sintered. After that, a p-type dopant was diffused only at the part corresponding to the opening of the mask for controlling diffusion in the silicon substrate by diffusing the p-type dopant by a thermal diffusion method at 1000° C. for 30 minutes, and a high-concentration p-doped region was formed. After the diffusion of the dopant, the mask for controlling diffusion was removed by soaking the silicon substrate in a hydrofluoric acid aqueous solution of about 10% for about 60 minutes.

Also for the n-type dopant diffusion, the masking paste was screen-printed again after providing partial openings in the screen on the backside of the silicon substrate, and then a high-concentration n-doped region was formed by applying the same step as described above.

The texture etching surface was formed on the photo-detecting surface by forming each doped region as described above, keeping this silicon substrate at 80° C., and soaking the substrate in 3% by mass of a potassium hydroxide solution in which 6% by mass of isopropyl alcohol is added as a surfactant into a potassium hydroxide solution for 40 minutes. In order to form a texture etching surface, an anisotropic etching method by an alkaline solution was used.

Next, a silicon nitride film was formed on both surfaces of the silicon substrate with PECVD (Plasma Enhanced Chemical Vapor Deposition). The silicon nitride film was made to be a passivation layer. A backside electrode type solar cell was produced by performing a hole opening process in the passivation layer on the backside, providing a p region contact hole and an n region contact hole, and forming a p electrode and an n electrode.

Example 5

First, 30 g of TEOS (tetraethylorthosilicate), 100 g of butyl cellosolve as a solvent, 10 g of water, and a few drops of hydrochloric acid were placed in a glass jar, the mixture was stirred well for 10 minutes, and left as it is for 6 hours. With this process, a chemical reaction was caused between TEOS and water using hydrochloric acid as a catalyst, and ethyl alcohol and Si(O)$_4$ were generated.

Finally, a masking paste was completed by mixing 10 g of ethyl cellulose as a thickening agent into the glass jar and stirring the mixture sufficiently.

Next, an example of a manufacturing method of a backside bonding type solar cell using the masking paste produced by the above-described method is described below using FIG. 2 as an example.

First, the entire surface of the photo-detecting side of n-type silicon semiconductor substrate 10 was screen-printed with masking paste 30, and dried at about 300° C. for 20 minutes using an oven. Next, masking paste 30 was screen-printed to a height of 10 μm by partially providing an opening of the screen of 0.5 mm with an interval of 1 mm on the backside, and dried with an oven again FIG. 2(a)).

Next, this n-type silicon semiconductor substrate 10 was baked under an oxygen atmosphere at 1000° C. for 60 minutes, and sintered to SiO$_2$ that is a material of mask for controlling diffusion 33 by baking masking paste 30.

After that, p-type dopant 31 is diffused only at the part corresponding to the opening of mask for controlling diffusion 33 in n-type silicon semiconductor substrate 10 by diffusing BBr$_3$ as p-type dopant 31 with a gas phase diffusion method at 1000° C. for 30 minutes, and high-concentration p-doped region 12 was formed (FIG. 2(b)).

After that, mask for controlling diffusion 33 was able to be removed by soaking n-type silicon semiconductor substrate 10 in hydrofluoric acid having a concentration of about 10% for about 1 minute.

Also for the n-type dopant diffusion, masking paste 30 was screen-printed again on the entire surface of the photo-detecting surface side of n-type silicon semiconductor substrate 10, dried, screen-printed by partially providing openings on the backside of the silicon substrate, dried, baked in the same condition as described above, and sintered to SiO$_2$ that is a material of mask for controlling diffusion 33 (FIG. 2(c)).

After that, high-concentration n-doped region 13 was formed by diffusing POCl$_3$ as n-type dopant 32 with a gas phase diffusion method at 900° C. for 30 minutes (FIG. 2(d)).

After forming each high-concentration-doped region as described above, mask for controlling diffusion 33 on both surfaces of n type silicon semiconductor substrate 10 was removed by soaking n-type silicon semiconductor substrate 10 in fluoric acid of about 10% for about 1 minute. Then, texture etching surface 18 was formed on the photo-detecting surface by forming a texture etching mask on the backside of n-type silicon substrate 10 with an oxide film, adding 5% by mass of isopropyl alcohol as a surfactant, and soaking the substrate into a 3% by mass potassium hydroxide solution kept at about 75 to 85° C. for 30 minutes.

Then, a silicon nitride film was formed on both surfaces of n-type silicon semiconductor substrate 10 by a plasma CVD method, and passivation layer 11 was formed (FIG. 2(e)).

After that, p region contact hole 16 and n region contact hole 17 were provided by performing a hole opening process in passivation layer 11 in the backside, and a backside bonding type solar cell was produced by forming p electrode 14 and n electrode 15 (FIG. 2(f)).

In order to investigate characteristics of the solar cell completed in such a manner, the short circuit current, open circuit voltage, curvature factor, and conversion efficiency were measured with a solar simulator (AM1.5). The results are shown in Table 1.

Comparative Example 1

A backside bonding type solar cell was produced using a photolithography technique instead of a masking paste.

First, an oxide film was formed on both surfaces of an n-type silicon semiconductor substrate by a normal pressure CVD method on the n-type silicon semiconductor substrate. Next, an opening was provided in the oxide film on the backside by a photolithography technique, BBr$_3$ was diffused as a p-type dopant by a gas phase diffusion method at 1000° C. for 20 minutes. With this operation, the p-type dopant was diffused only at the part corresponding to the opening of the oxide film into the n-type silicon semiconductor substrate, and a high-concentration p-doped region was formed. After that, the oxide film was removed completely with fluoric acid of about 10%. The opening of the oxide film had the same shape as in Example 1.

Again, an oxide film was formed on both surfaces of the silicon semiconductor substrate in the same manner, an opening in the oxide film was formed on the backside by a photolithography technique, and a high-concentration n-doped region was formed by diffusing POCl$_3$ as an n-type dopant by a gas phase diffusion method at 900° C. for 20 minutes.

After that, a backside bonding type solar cell was produced by removing completely the oxide film with fluoric acid in the same manner as described above and forming a texture etching surface, a passivation layer, a p electrode, and an in electrode in the same manner as in Example 5.

The result of measuring the solar cell characteristics of the manufactured solar cell in the same manner as in Example 5 is also written in Table 1.

(Evaluation Result)

The characteristics of each solar cell manufactured in Examples and Comparative Example of the present invention were measured and compared. As a result, there was no inferiority in the backside bonding type solar cell according to the manufacturing method of the present invention (Example 5) compared with the conventional backside bonding type solar cell according to the manufacturing method including a photolithography step (Comparative Example 1). Further, it was found that high characteristics of a solar cell could be obtained.

TABLE 1

| | SHORT CIRCUIT CURRENT Jsc (mA/cm$^2$) | OPEN CIRCUIT VOLTAGE Voc (V) | CURVATURE FACTOR F.F | CONVERSION EFFICIENCY Eff (%) |
|---|---|---|---|---|
| EXAMPLE 5 | 38.6 | 0.645 | 0.768 | 19.2 |
| COMPARATIVE EXAMPLE 1 | 38.8 | 0.647 | 0.774 | 19.4 |

It should be considered that the embodiment and examples disclosed at this time are exemplary in all respects and they are not limitative. The masking paste can be also applied for solar cells with a selected emitter structure and a partial BSF structure that do not require as highly an accurate pattern as a backside bonding type solar cell in addition to the backside bonding type solar cell according to the Examples. The scope of the present invention is shown by the scope of the claims and not by the above description, and it is intended that meanings equivalent to the scope of the claims and all variations within the scope are included.

INDUSTRIAL APPLICABILITY

By using the masking paste of the present invention, a fine patterning in an n-doped region and a p-doped region can be formed easily and less expensively, and a backside electrode type solar cell can be manufactured with a low cost.

By using the masking paste, applying it in a desired shape, and forming a mask for controlling diffusion, a fine patterning in an n-doped region and a p-doped region can be formed easily, and a backside bonding type solar cell can be manufactured less expensively.

The invention claimed is:

1. The manufacturing method of a solar cell comprising the step of:
   applying a masking paste containing $SiO_2$ and/or a $SiO_2$ precursor with a pattern on a semiconductor substrate,
   drying the paste after the step of applying a paste containing $SiO_2$ and/or a $SiO_2$ precursor with a pattern on a semiconductor substrate,
   baking the paste in an oxygen atmosphere to form a mask for controlling diffusion of a dopant,
   diffusing the dopant to form a patterned diffusion layer, wherein a masking paste used as said mask for controlling diffusion is manufactured by preparing a mixed liquid containing
   (a) a formula $R'_n Si(OR)_4$, (R' is methyl, ethyl, or phenyl, R is methyl, ethyl, n-propyl, or i-propyl, and n is 0, 1, or 2),
   (b) a solvent,
   (c) an acid, and
   (d) water,
   and then vaporizing alcohol by heating at a temperature not lower than the boiling point of the alcohol produced by a hydrolysis reaction of said (a) and not higher than the boiling point of the solvent.

2. The manufacturing method of a solar cell according to claim 1, wherein the dopant is supplied through a gas phase or liquid coating.

3. The manufacturing method of a solar cell according to claim 1, wherein said baking is performed at a baking temperature of 800 to 1050° C. and for a baking time of 10 to 60 minutes.

4. The manufacturing method of a solar cell according to claim 1, wherein said diffusion temperature of the diffusion of the dopant is not lower than 800° C. for a p-type dopant diffusion and not lower than 700° C. for an n-type dopant diffusion.

5. The manufacturing method of a solar cell according to claim 1, wherein said paste contains 5 to 25% by mass of tetraethylorthosilicate as the $SiO_2$ precursor, 5 to 25% by mass of ethyl cellulose as a thickening agent, and an acid as a catalyst for a hydrolysis reaction of tetraethylorthosilicate.

6. The manufacturing method of a solar cell according to claim 1, wherein a masking paste used as said mask for controlling diffusion is manufactured by preparing a mixed liquid containing
   (a) a formula $R'_n Si(OR)_{4-n}$ (R' is methyl, ethyl, or phenyl, R is methyl, ethyl, n-propyl, or i-propyl, and n is 0, 1, or 2),
   (b) a solvent,
   (c) a thickening agent,
   (d) an acid, and
   (e) water,
   and then vaporizing alcohol by heating at a temperature not lower than the boiling point of the alcohol produced by a hydrolysis reaction of said (a) and not higher than the boiling point of the solvent.

* * * * *

UNITED STATES PATENT AND TRADEMARK OFFICE
CERTIFICATE OF CORRECTION

PATENT NO.         : 7,846,823 B2                                        Page 1 of 1
APPLICATION NO.    : 12/063542
DATED              : December 7, 2010
INVENTOR(S)        : Funakoshi It is certified that error appears in the above-identified patent and that said Letters Patent is hereby corrected as shown below:

Column 15, line 32 "$R'_n Si(OR)_4$" should read -- $R'_n Si(OR)_{4-n}$ --.

Signed and Sealed this
Nineteenth Day of April, 2011

David J. Kappos
*Director of the United States Patent and Trademark Office*